United States Patent
Bu et al.

(10) Patent No.: US 7,838,203 B1
(45) Date of Patent: Nov. 23, 2010

(54) SYSTEM AND METHOD FOR PROVIDING PROCESS COMPLIANT LAYOUT OPTIMIZATION USING OPTICAL PROXIMITY CORRECTION TO IMPROVE CMOS COMPATIBLE NON VOLATILE MEMORY RETENTION RELIABILITY

(75) Inventors: Jiankang Bu, Windham, ME (US); Kenneth M. Lewis, Scarborough, ME (US); Li-Heng Chou, Portland, ME (US)

(73) Assignee: National Semiconductor Corporation, Santa Clara, CA (US)

( * ) Notice: Subject to any disclaimer, the term of this patent is extended or adjusted under 35 U.S.C. 154(b) by 994 days.

(21) Appl. No.: 11/598,560

(22) Filed: Nov. 13, 2006

(51) Int. Cl.
- *H01L 21/00* (2006.01)
- *H01L 21/336* (2006.01)
- *H01L 21/3205* (2006.01)
- *G03F 1/00* (2006.01)

(52) U.S. Cl. .......................... 430/319; 430/5; 430/311; 430/313; 438/267; 438/593

(58) Field of Classification Search ............ 430/5, 430/311; 716/19, 20, 21; 438/257
See application file for complete search history.

(56) References Cited

U.S. PATENT DOCUMENTS

| | | | |
|---|---|---|---|
| 5,881,125 A * | 3/1999 | Dao | 430/5 |
| 5,989,756 A * | 11/1999 | Nakae | 430/5 |
| 6,015,736 A | 1/2000 | Luning et al. | |
| 6,057,081 A | 5/2000 | Yunogami et al. | |
| 6,153,478 A | 11/2000 | Lin et al. | |
| 6,229,683 B1 | 5/2001 | Goodwin-Johansson | |
| 6,238,850 B1 | 5/2001 | Bula et al. | |
| 6,296,991 B1 | 10/2001 | Lin | |
| 6,387,755 B1 | 5/2002 | Thurgate et al. | |
| 6,482,728 B2 * | 11/2002 | Shin et al. | 438/593 |
| 6,632,321 B2 | 10/2003 | Lill et al. | |
| 6,670,081 B2 | 12/2003 | Laidig et al. | |
| 6,716,570 B2 | 4/2004 | Nagarajan et al. | |
| 6,794,279 B1 | 9/2004 | Stephen et al. | |
| 6,846,618 B2 | 1/2005 | Hsu et al. | |
| 7,041,434 B2 | 5/2006 | Raebiger et al. | |
| 7,488,672 B2 | 2/2009 | Kim | |

(Continued)

OTHER PUBLICATIONS

Li-Heng Chou, et al., "Method for Forming Non-Volatile Memory Cells and Related Apparatus and System", U.S. Appl. No. 12/151,437 filed May 7, 2008.

(Continued)

*Primary Examiner*—Mark F Huff
*Assistant Examiner*—Jonathan Jelsma (57) ABSTRACT

A system and method are disclosed for increasing retention reliability of a floating gate of a CMOS compatible memory cell. A mask structure is formed with a plurality of apertures near the edges of the mask structure. The size of the apertures is less than a resolution limitation of a photo exposure system. The mask structure is placed over a resist material and the resist material is exposed to light through the apertures of the mask structure. Zero order diffraction light passes though the apertures and imparts energy to the exposed portions of the resist material. A develop process is then used to remove portions of the resist material to form a sloped edge resist pattern. A sloped edge floating gate that is formed from the pattern facilitates the deposition of a thicker oxide layer at the sloped edge of the floating gate and reduces backend leakage current.

20 Claims, 9 Drawing Sheets

U.S. PATENT DOCUMENTS

| | | |
|---|---|---|
| 7,537,979 B2 | 5/2009 | Isobe et al. |
| 2002/0145915 A1 | 10/2002 | Ogura et al. |
| 2004/0023499 A1 | 2/2004 | Hellig et al. |
| 2006/0273166 A1 | 12/2006 | Ohshima |
| 2007/0037098 A1 | 2/2007 | Anderson et al. |
| 2007/0148973 A1 | 6/2007 | Higashitani et al. |
| 2008/0048164 A1 | 2/2008 | Odagawa |

OTHER PUBLICATIONS

S. Manakli, et al., "Combination multiple focal planes and PSM for sub 120 nm node with KrF lithography: study of the proximity effects," Elsevier Microelectronic Engineering 61-62 (2002) pp. 123-132.

Benedetto Vigna, "More than Moore: micro-machined products enable new applications and open new markets", 2005 IEEE, 8 pages.

Li-Heng Chou, et al., "Photo-Focus Modulation Method for Forming Transistor Gates and Related Transistor Devices", U.S. Appl. No. 11/901,654 filed Sep. 18, 2007.

Alfred K. Wong, "Microlithography: Trends, Challenges, Solutions, and Their Impact on Design", 2003 IEEE, pg. 12-21.

Office Action dated Feb. 18, 2010 in connection with U.S. Appl. No. 11/901,654.

Office Action dated Aug. 10, 2009 in connection with U.S. Appl. No. 11/901,654.

\* cited by examiner

PROCESSING DISTORTIONS →

SYSTEM AND METHOD FOR PROVIDING PROCESS COMPLIANT LAYOUT OPTIMIZATION USING OPTICAL PROXIMITY CORRECTION TO IMPROVE CMOS COMPATIBLE NON VOLATILE MEMORY RETENTION RELIABILITY

TECHNICAL FIELD OF THE INVENTION

The present invention is generally directed to the manufacture of integrated circuits and, in particular, to a system and method for providing process compliant layout optimization for complementary metal oxide semiconductor (CMOS) compatible EEPROM devices using optical proximity correction.

BACKGROUND OF THE INVENTION

A fundamental design challenge in creating a memory cell of an electrically erasable programmable read only memory (EEPROM) device is to use a controllable and reproducible electrical effect that has sufficient non-linearity so that the memory cell (1) can be written to (or erased) at one voltage in less than one millisecond (1 ms) and can be read at another voltage, and (2) the data within the memory cell must remain unchanged for more than ten (10) years.

Prior art stacked/split gate EEPROM technology requires (1) special multi-polysilicon materials, (2) different gate oxide thicknesses, and (3) modified doping profiles. These prior art requirements create process complexity and high cost when embedded into a complementary metal oxide semiconductor (CMOS) process.

In the manufacture of CMOS compatible EEPROM devices it is desirable to maximize the retention reliability of the memory cells. The program and erase operation in a typical memory cell is performed through a "front end" dielectric layer that is located between the floating gate and the silicon substrate of the memory cell. The dielectric layers that are located above the floating gate are referred to as a "backend" dielectric layers. The backend dielectric layers are known to be "leaky" because some of the electrons that are stored on the floating gate will pass from the floating gate through the backend dielectric layers and ultimately move down to the substrate.

This loss of electrons from the floating gate is a unique retention failure mechanism for CMOS compatible nonvolatile memory (NVM) cells. This loss of electrons decreases the retention reliability of memory cells in EEPROM devices.

Therefore, there is a need in the art for a system and method that is capable of solving the problem described above that is exhibited by prior art memory cells. In particular, there is a need in the art for a system and method that provides EEPROM devices that have an improved retention reliability for the electrons that are stored on the floating gates of the EEPROM memory cells.

As will be later described in more detail, the present invention provides a system and method that improves the retention reliability for electrons that are stored on the floating gates of CMOS compatible EEPROM memory cells by using a technique that is known as optical proximity correction. In order to better understand the principles of operation of the present invention, the basic principle of optical proximity correction will first be described.

Figure 1A:
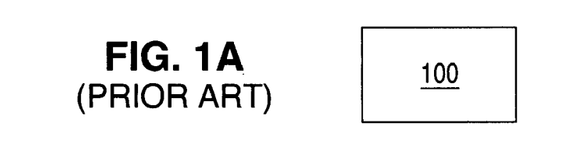
FIG. 1A illustrates a schematic diagram showing a plan view of a prior art original mask design having a rectangular shape.
Figure 1B:
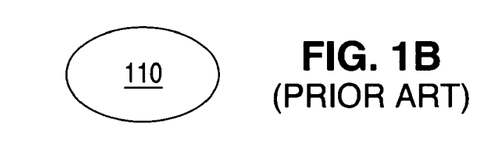
FIG. 1B illustrates a schematic diagram showing a plan view of the final printed image of the prior art original mask design shown in FIG. 1A where the final printed image has experienced processing distortions during the mask process that cause the final printed image to have rounded corners and an oblong shape.

Optical proximity correction (OPC) is a technique that corrects distortions that occur in a final printed image relative to an original mask design. Optical distortions relative to the original mask design may be introduced by the exposure tool and various processing effects. For example, FIG. 1A illustrates an original mask design 100 that has a rectangular shape. Processing distortions that occur during the mask process may cause the final printed image 110 (as shown in FIG. 1B) to have rounded corners and thus have an oblong shape. Depending upon the type and nature of the distortions, such distortions can lead to a variety of problems such as poor device performance, reliability problems or device failure.

The technique of optical proximity correction attempts to minimize the distortions that are present in the final printed image by altering the shape of the original mask design so that when the distortions occur the final printed image possesses the desired pattern shape. The altered shape of the original mask design compensates for and negates the effect of the distortions.

Figure 2A:
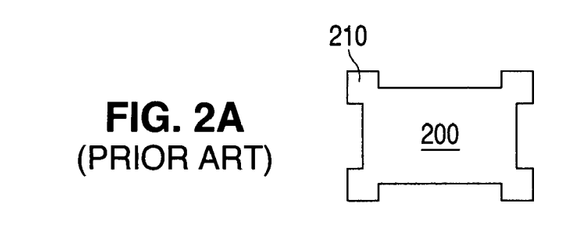
FIG. 2A illustrates a schematic diagram showing a plan view of a prior art original mask design having a rectangular shape and having square extensions on each corner of the rectangular shape.
Figure 2B:
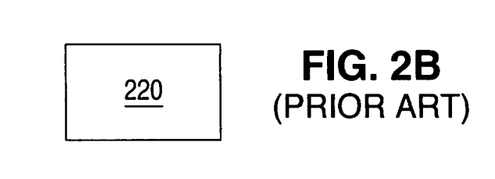
FIG. 2B illustrates a schematic diagram showing a plan view of the final printed image of the prior art original mask design shown in FIG. 2A where the final printed image has experienced processing distortions during the mask process that cause the final printed image to have a rectangular shape.

For example, the original mask design 200 shown in FIG. 2A comprises a rectangular shape that has a square extension 210 located at each corner. The extensions 210 are sometimes referred to as serifs 210. The processing distortions that occur during the mask process cause the final printed image 220 (as shown in FIG. 2B) to have the desired rectangular shape. The extensions 210 in the original mask design 200 have compensated for the effects of the processing distortions.

Optical proximity correction (OPC) has been employed in nonvolatile memory (NVM) layout design to improve design performance. For example, in split gate flash technologies, the corners of the floating gate need to be sharp in order to enhance the Fowler-Nordheim (FN) tunneling current during erase operations. However, it is known that the processing distortions cause the corners of the floating gate to be rounded to some extent. Optical proximity correction (OPC) is used to make compensating adjustments to the shape of the original mask design for the floating gate.

Figure 3A:
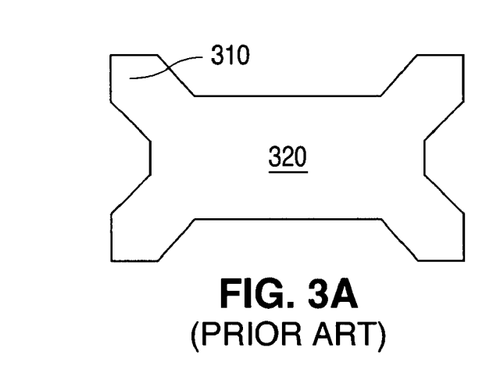
FIG. 3A illustrates a schematic diagram showing a plan view of a prior art original mask design of a floating gate having a rectangular shape and having extensions on each corner of the rectangular shape of the floating gate.
Figure 3B:
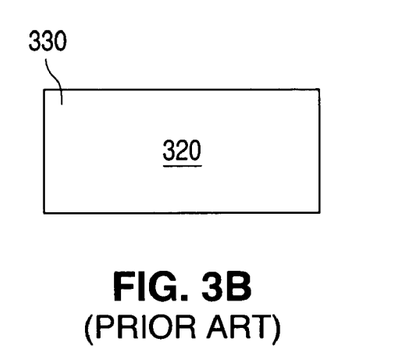
FIG. 3B illustrates a schematic diagram showing a plan view of the final printed image of the prior art original mask design of the floating gate shown in FIG. 3A where the final printed image has experienced processing distortions during the mask process that cause the final printed image of the floating gate to have a rectangular shape.

For example, the shape of the original mask design 300 for the floating gate (as shown in FIG. 3A) has been altered to provide extensions 310 on each corner of the floating gate mask. The processing distortions that occur during the mask process cause the final printed image 320 of the floating gate (as shown in FIG. 3B) to have the desired rectangular shape and to have sharp corners 330. The extensions 310 in the original mask design 300 have compensated for the effects of the processing distortions.

Figure 4:
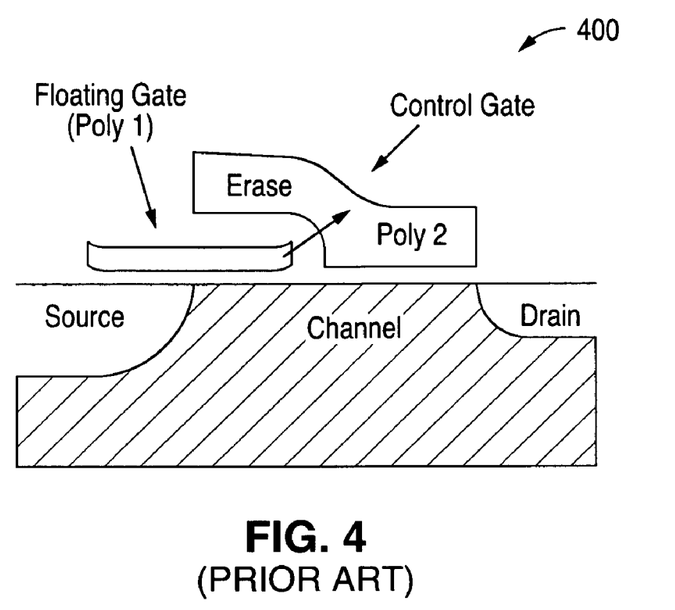
FIG. 4 illustrates a schematic cross sectional diagram of an exemplary prior art split gate non volatile memory (NVM) cell.

For split gate nonvolatile memory (NVM) cells or stacked gate nonvolatile memory (NVM) cells, the Fowler-Nordheim (FN) tunneling erase operation is between the floating gate (FG) and the control gate (CG). A cross sectional view of a typical prior art split gate nonvolatile memory (NVM) cell 400 is shown in FIG. 4. The floating gate is formed from a first polysilicon layer (Poly 1) and the control gate is formed from a second polysilicon layer (Poly 2). The interpoly oxide between the floating gate and the control gate (not shown in FIG. 4) provides the necessary isolation to enable the electrons to remain on the floating gate for up to the required ten (10) year data retention period. A sharp corner on the floating gate enhances the Fowler-Nordheim (FN) tunneling current and facilitates the erase process.

Figure 5:
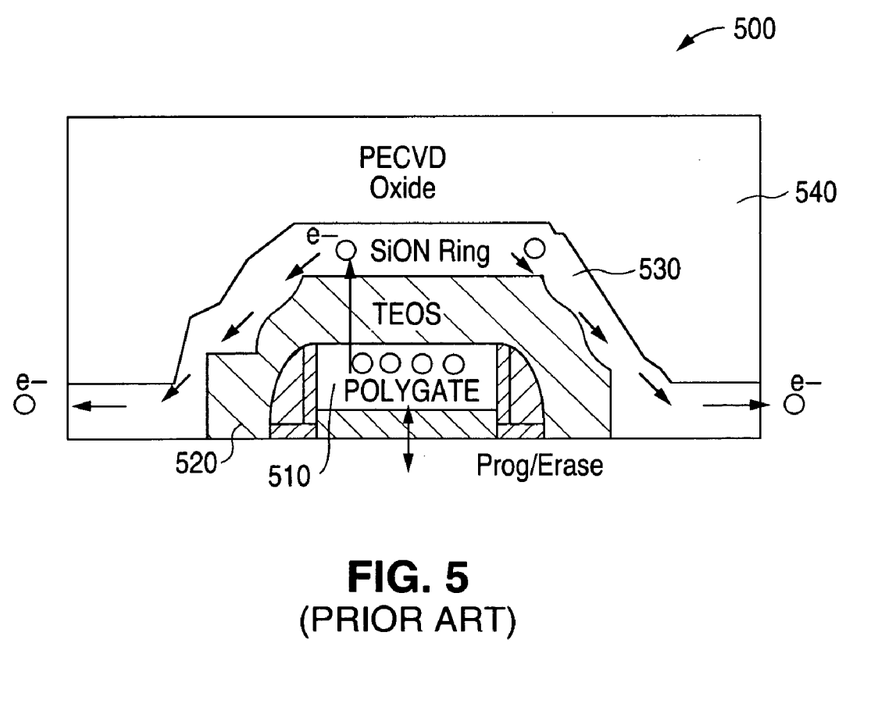
FIG. 5 illustrates a schematic cross sectional diagram of an exemplary prior art CMOS compatible non volatile memory (NVM) cell.

A different situation exists in the case of a CMOS compatible nonvolatile memory (NVM) cell. A cross sectional view of a typical prior art CMOS compatible nonvolatile memory (NVM) cell 500 is shown in FIG. 5. The program operation and the erase operation occur through the "front end" gate oxide that is located between the polysilicon floating gate and the silicon substrate. The leaky "backend" dielectric layers are located over the polysilicon floating gate.

Memory cell 500 comprises a polysilicon gate 510 (designated "POLY GATE 510" in FIG. 5). Polysilicon gate 510 and other elements of the memory cell 500 are covered with backend dielectric 520. In this example backend dielectric 520 is made of tetraethyloxysilane (TEOS). Therefore, backend dielectric 520 is designated as "TEOS 520" in FIG. 5.

Backend dielectric TEOS 520 is covered with backend dielectric 530. In this example backend dielectric 530 is made of silicon oxynitride (SiON). Therefore, backend dielectric 530 is designated "SiON 530" in FIG. 5. Lastly, backend dielectric 530 is covered with backend dielectric 540. In this example backend dielectric 540 is made of plasma enhanced chemical vapor deposition (PECVD) oxide. Therefore, backend dielectric 540 is designated "PECVC oxide 540" in FIG. 5.

The fabrication process for a single poly NVM device is compatible with CMOS devices. The polysilicon gate in an NVM device is a floating gate (FG) that store electrons. The backend dielectric layers (TEOS 520, SiON 530, PECVD oxide 540) have a higher density of defects/traps than a front end gate oxide layer. The higher density of defects/traps enhances the Trap-Assisted-Tunneling (TAT) of electrons in the oxide layers. The higher density of defects/traps enhances thermal excitation in the silicon oxynitride (SiON) layer.

In a CMOS process the silicon oxynitride (SiON) layer is designed to be leaky (i.e., to have more defects/traps) in order to prevent plasma induced damage. Electrons stored on the polysilicon floating gate 510 may tunnel through the TEOS layer 520 to arrive at the leaky silicon oxynitride layer 530 (SiON 530). From the SiON layer 530 the electrons can easily move to the substrate layer (not shown in FIG. 5). This results in a higher charge decay rate for electrons that are stored on the floating gate. This also results in retention degradation especially at higher temperatures.

The phenomenon of backend charge leakage is a serious problem for CMOS compatible NVM devices. Several different methods have been explored to reduce the leakage of charge from the backend dielectric layers in order to improve CMOS compatible retention performance.

A first approach has been to add a mask to the silicon oxynitride (SiON) layer 530 to etch the silicon oxynitride (SiON) layer 530 away from the top of the floating gate (FG) 110. The mask allows the SiON layer 530 to be selectively etched from the top of the NVM devices. The SiON layer 530 is left on top of the CMOS devices. The absence of SiON layer 530 over the top of the floating gate (FG) 510 breaks the charge leakage path. Electrons on the floating gate (FG) 510 therefore have a much slower decay rate by tunneling in oxide instead of going through a relatively leaky SiON layer 530 that is connected to the substrate.

A second approach has been to increase the thickness of the TEOS layer 520. This increases the tunneling distance from the floating gate (FG) 510 to the SiON layer 530. This causes the electrons to take a longer time to arrive at the relatively leaky SiON layer 530.

A third approach has been to modulate the density of the defects/traps in the TEOS layer 520 in order to make the TEOS layer 520 highly non-conductive. The fewer defects/traps there are in the TEOS layer 520, the less conductivity there is in the TEOS layer 520. Electrons that arrive at the TEOS layer 520 will have difficulty in traveling to other locations. The electrons that collect in the TEOS layer 520 will deter further leakage of electrons from the floating gate (FG) 510.

CMOS compatible NVM performance is not as good as other types of NVM technology (e.g., stacked gate NVM, split gate NVM, SONOS (silicon-oxide-nitride-oxide-silicon) NVM). CMOS compatible NVM performance has slow speed, low density and limited endurance. But it has one major advantage. It has low cost because its fabrication process is compatible with CMOS processes. CMOS compatible NVM technology is advantageous in some applications where limited speed, density and endurance NVM technology is needed but the cost would be too high if mainstream NVM technology were employed. Therefore, the low cost feature is critical to CMOS compatible NVM technology.

The three approaches mentioned above for improving CMOS compatible NVM retention performance have significant drawbacks. The first approach requires the addition of a mask and etch step to the standard CMOS process. This increases the cost. More importantly, when etching the SiON layer 530 from the top of the floating gate (FG) 510, limited etch selectivity between the SiON layer 530 and the TEOS layer 520 always leads to some over-etch of the TEOS layer 520. A thinner TEOS layer 520 will lead to an increased level of electron discharge from the floating gate (FG) 510. In addition, etching away the SiON layer 530 will expose the floating gate (FG) 510 and the TEOS layer 520 to backend plasma damage. This will lead to a degradation of the NVM device retention.

The second approach requires an increase in the thickness of the TEOS layer 520. In order to get a satisfactory retention performance the TEOS layer 520 needs to have at least a double thickness. The creation of a thicker TEOS layer 520 alters the CMOS process and significantly alters the device parameters. After this step the NVM device is no longer CMOS compatible.

The third approach results in plasma induced damage. The CMOS process requires that the SiON layer 530 be leaky so that charges from the plasma process have a leakage path.

Furthermore, it is known that the presence of a sharp corner at the edge of the floating gate increases the electron tunneling current from the floating gate. This increase in electron tunneling current from the floating gate further degrades the retention reliability of the memory cell.

Figure 6:
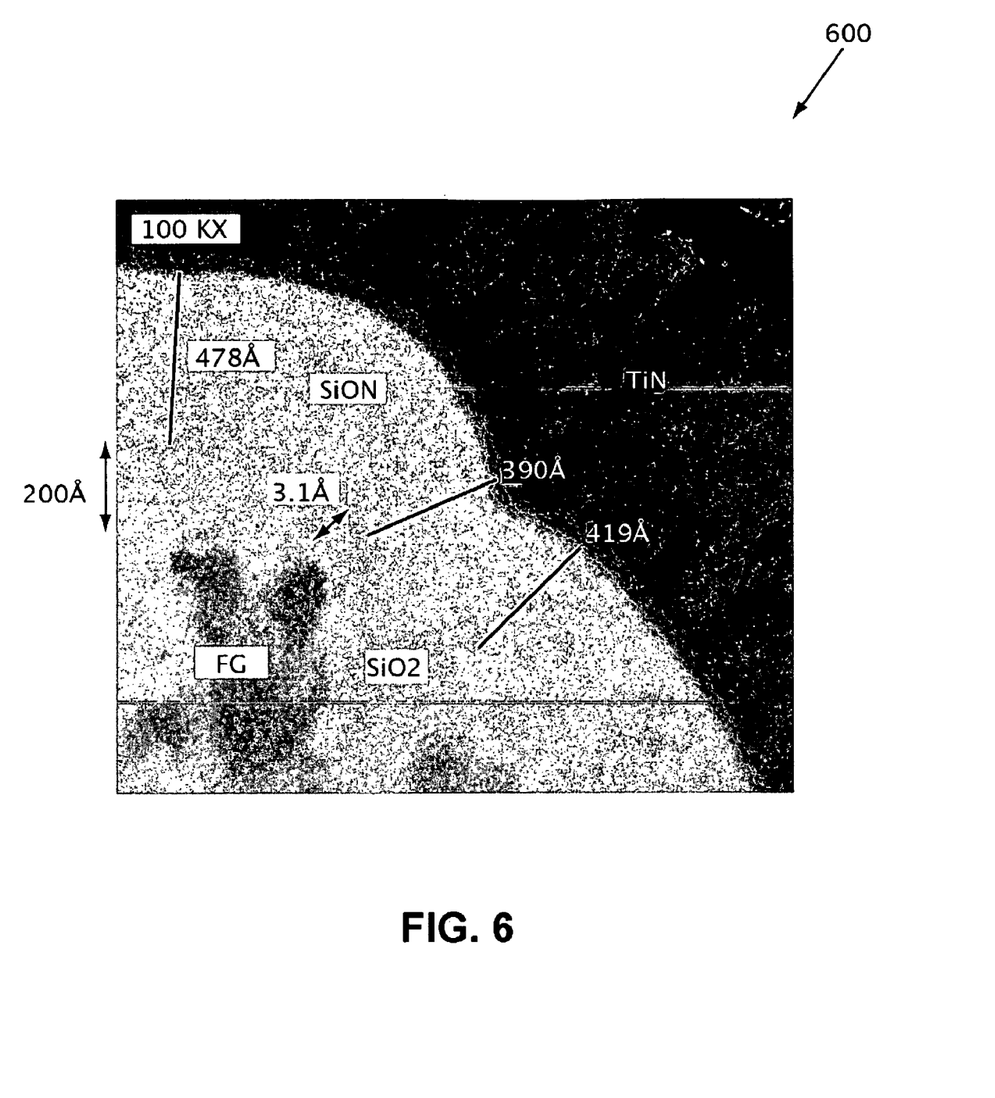
FIG. 6 illustrates a tunneling electron microscope (TEM) photograph showing a cross sectional view of a corner of a prior art floating gate showing that the coverage of an oxide layer over the floating gate is much thinner at the corner and edge of the floating gate than over the top of the floating gate.

Consider, for example, the tunneling electron microscope (TEM) photograph 600 shown in FIG. 6. Photograph 600 illustrates a cross sectional view of a corner of a prior art floating gate (FG) showing that the coverage of the oxide layer over the floating gate is much thinner at the corner and edge of the floating gate (than over the top of the floating gate). As shown in the photograph 600, the thickness of the coverage of the oxide layer over the top of the floating gate (indicated with double arrows) is approximately two hundred Angstroms (200 Å). As also shown in the photograph 600, the thickness of the oxide layer at the corner and edge of the floating gate (FG) (also indicated with double arrows) is approximately thirty one Angstroms (31 Å).

The difference in thickness is due to the process limitations of the oxide deposition process. The thinness of the oxide layer at the corner of the floating gate contributes to the loss of electrons from the floating gate and increases the backend leakage current of electrons from the floating gate. The thinness of the oxide layer at the corner of the floating gate significantly degrades the retention liability of the EEPROM memory cell.

One prior art approach to solving this problem is to etch the floating gate at a tilted angle. Another prior art approach is the deposit extra amounts of oxide to make the oxide layer thicker and both the center and the edge of the floating gate. These prior art approaches can reduce the backend leakage current of the electrons from the floating gate and improve retention reliability. However, these approaches require changes to the core CMOS process and/or add extra processing steps. This increases the cost and complexity of manufacturing the CMOS compatible EEPROM memory cell.

The prior art approaches are deficient in that they can not increase the oxide thickness at the corner of the floating gate without changing the core CMOS process and/or adding extra cost and processing steps. The optical proximity correction can be applied to change the two dimensional shape of the floating gate (as seen from a top down view) to round the corner of the floating gate. However, this does not change the vertical shape of the floating gate (as seen in a cross sectional view) and does not solve the problem of the thinness of the oxide layer at the edge of the floating gate.

Therefore, there is a need in the art for a system and a method that can (1) alter the cross sectional shape of the floating gate to enable the deposition of a thicker oxide layer at the edge of the floating gate, and (2) thereby reduce charge leakage from the floating gate and increase retention reliability of the memory cell, and (3) not increase the cost and complexity of manufacturing the memory cell. There is a need in the art for a system and a method that can increase the retention reliability of the floating gate of the CMOS compatible memory cell without increasing the manufacturing cost and without changing the core CMOS manufacturing process of the memory cell.

The present invention provides a system and method for altering the cross sectional shape of the floating gate to enable the deposition of a thicker oxide layer at the edge of the floating gate. In one advantageous embodiment of the present invention, a mask structure is prepared that has portions that form a plurality of apertures near the edges of the mask structure. The size of the apertures are intentionally selected to be less than a resolution limitation of a Photo Exposure System.

The mask structure of the invention is placed over a photo resist material. The photo resist material is exposed to a light source of the Photo Exposure System through the mask structure. Only zero order diffraction light can pass through the apertures because the size of the apertures is less than the resolution limitation. The zero order diffraction light imparts enough accumulated energy to partially change the exposed portions of the photo resist material.

A subsequent develop process removes portions of the photo resist material that were exposed to the zero order diffraction light through the apertures to form a sloped surface from the top to the edge of the photo resist material. The resulting sloped surface photo resist pattern is subsequently transferred to a floating gate of a nonvolatile memory cell in a polysilicon etch process.

The sloped edge of the floating gate is then covered with a dielectric layer during a manufacturing process of a CMOS compatible nonvolatile memory cell. The thickness of the dielectric layer over the sloped edge of the floating gate reduces the backend leakage current of electrons from the floating gate and thus improves the retention reliability of the nonvolatile memory cell.

Before undertaking the Detailed Description of the Invention below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like.

Definitions for certain words and phrases are provided throughout this patent document, those of ordinary skill in the art should understand that in many, if not most instances, such definitions apply to prior uses, as well as to future uses, of such defined words and phrases.

BRIEF DESCRIPTION OF THE DRAWINGS

For a more complete understanding of the present invention and its advantages, reference is now made to the following description taken in conjunction with the accompanying drawings, in which like reference numerals represent like parts.

DETAILED DESCRIPTION OF THE INVENTION

FIGS. 7 through 16, discussed below, and the various embodiments used to describe the principles of the present invention in this patent document are by way of illustration only and should not be construed in any way to limit the scope of the invention. Those skilled in the art will understand that the principles of the present invention may be implemented with any type of suitably arranged electrically erasable programmable read only memory (EEPROM) device.

As previously described, the backend leakage of electrons from the floating gate through backend dielectric layers is a unique retention failure mechanism for CMOS compatible nonvolatile memory (NVM) cells. The present invention reduces this leakage current and increases the retention reliability of the memory cells by increasing the conformity of the backend dielectric layer (e.g., TEOS layer 520) over the floating gate (e.g., floating gate 510). The present invention increases the conformity of the backend dielectric layer by providing a system and method for rounding the vertical corners of the periphery of the floating gate. The present invention achieves this goal at the lowest possible cost.

The present invention uses the principles of optical proximity correction (OPC). In a prior art Photo Exposure System the resolution that can be achieved by a mask layout on a silicon wafer is described by the following equation:

$$\text{Resolution} = k1 \frac{\text{Wavelength}}{\text{Numerical Aperture}} \quad \text{Eq. (1)}$$

The resolution is proportional to the wavelength and inversely proportional to the numerical aperture (NA). The constant of proportionality (k1) is a value that depends on the resist process and other factors.

The table below sets forth exemplary values of resolution that can be achieved with an exposure source that has a wavelength of two hundred forty eight nanometers (248 nm). The expression "k1" represents the proportionality constant in Equation (1).

| Numerical Aperture | k1 | Resolution |
|---|---|---|
| 0.55 | 0.1 | 45.1 |
| 0.55 | 0.2 | 90.2 |

-continued

| Numerical Aperture | k1 | Resolution |
|---|---|---|
| 0.55 | 0.3 | 135.3 |
| 0.55 | 0.4 | 180.4 |
| 0.55 | 0.5 | 225.5 |
| 0.60 | 0.1 | 41.3 |
| 0.60 | 0.2 | 82.7 |
| 0.60 | 0.3 | 124.0 |
| 0.60 | 0.4 | 165.3 |
| 0.60 | 0.5 | 206.7 |
| 0.65 | 0.1 | 38.2 |
| 0.65 | 0.2 | 76.3 |
| 0.65 | 0.3 | 114.5 |
| 0.65 | 0.4 | 152.6 |
| 0.65 | 0.5 | 190.8 |
| 0.70 | 0.1 | 35.4 |
| 0.70 | 0.2 | 70.9 |
| 0.70 | 0.3 | 106.3 |
| 0.70 | 0.4 | 141.7 |
| 0.70 | 0.5 | 177.1 |

Figure 7:
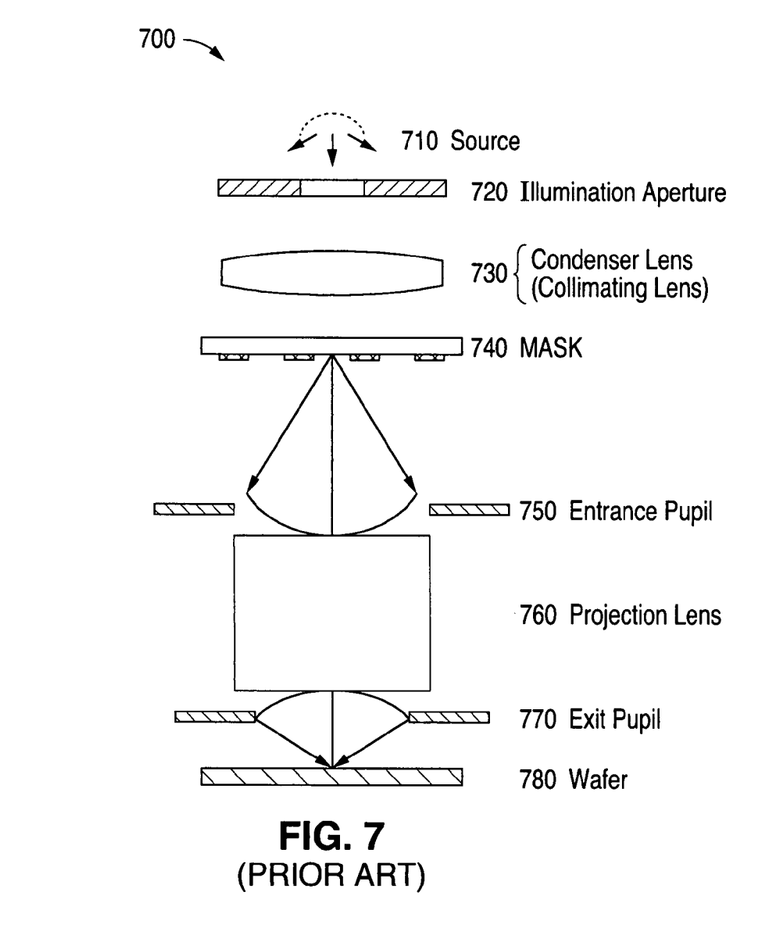
FIG. 7 illustrates a schematic diagram of an exemplary prior art photo exposure system.

The principle of a prior art Photo Exposure System is illustrated in FIG. 7. FIG. 7 illustrates a schematic diagram of an exemplary Photo Exposure System 700. Light from a source 710 passes through an illumination aperture 720 and through condenser lens 730 (collimating lens 730). Light from the lens 730 then passes through transparent portions of a mask 740.

Figure 8:
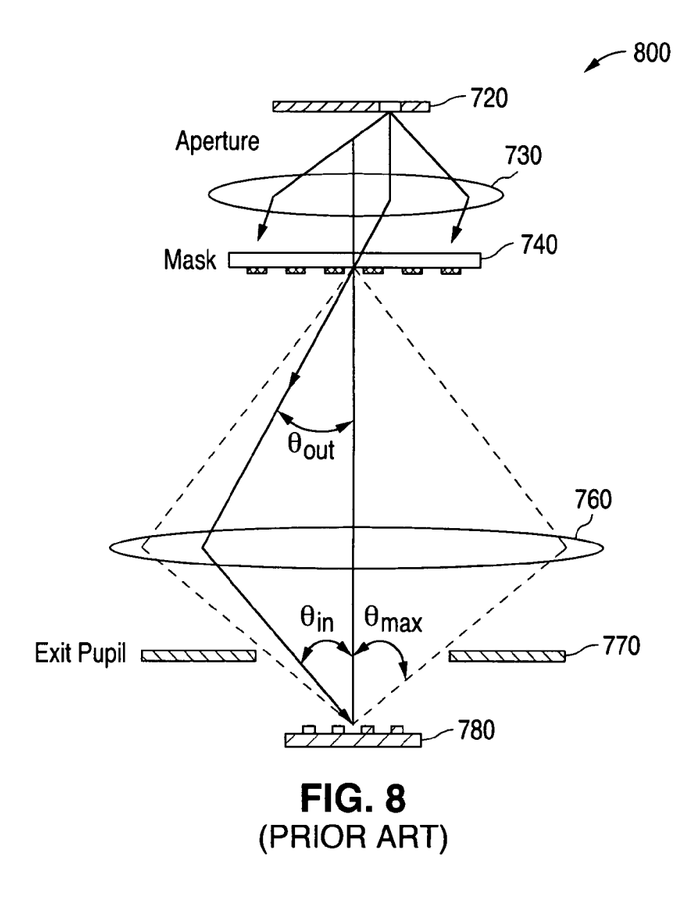
FIG. 8 illustrates another schematic diagram of the exemplary prior art photo exposure system shown in FIG. 7.

Light that has passed through the transparent portions of mask 740 then pass through an entrance pupil 750, a projection lens 760 (illustrated schematically in FIG. 7), and an exit pupil 770. Lastly, the light is focused on a silicon wafer 780. Another schematic diagram 800 of the Photo Exposure System is shown in FIG. 8 to illustrate the angles of the light as it passes through the projection lens 760.

Forming an image on a silicon wafer 780 requires at least two beams of light. For a fixed Photo Exposure System the resolution of the system is fixed. If a layout feature on the mask 740 is smaller than the resolution limitation, then only the zero order diffraction of the light will be collected by the projection lens 760. The zero order diffraction of the light cannot form an image but can increase the exposure energy in the resist material.

During the development process, layout features on the mask 740 that are larger than the resolution limitation will be fully developed and shown on the silicon wafer 780. That is, the exposed resist material will be completely developed and removed. Resist material that is not exposed will remain on the silicon wafer 780. For small features that are less than the resolution limitation in size, the exposed resist material will be partially removed. The amount of the exposed resist material that is removed will depend on how much exposure energy the resist material receives.

Figure 9:
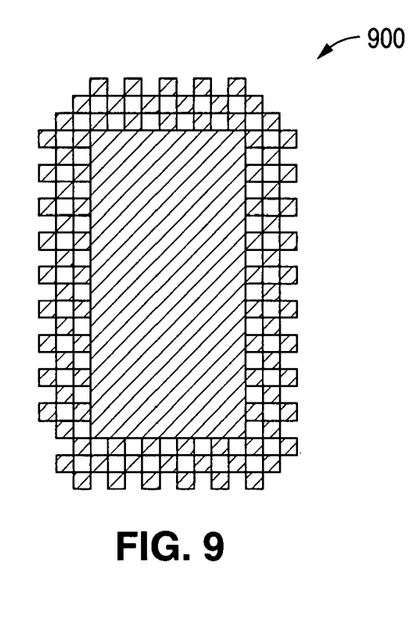
FIG. 9 illustrates a plan view of an exemplary mask structure of the present invention.
Figure 10:
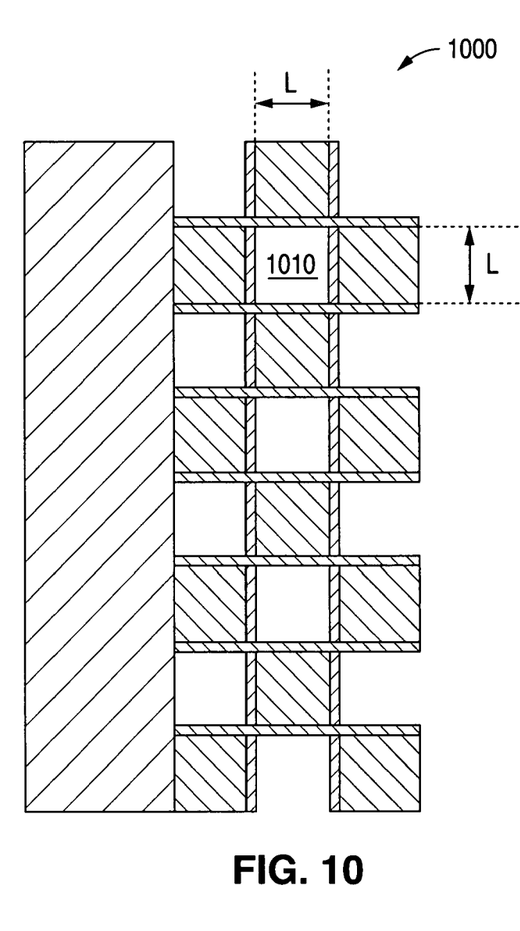
FIG. 10 illustrates an enlarged view of a portion of the plan view of the periphery of the mask structure of the present invention shown in FIG. 9.

The present invention uses this important physical fact to create an improved floating gate structure. A plan view of an exemplary mask structure 900 of the present invention is shown in FIG. 9. As shown in FIG. 9, the periphery of the mask structure 900 is formed with portions that define an alternating "mosaic" of squares of mask material and squares of apertures through the mask material. An enlarged view of a portion 1000 of the plan view of the periphery of mask structure 900 is shown in FIG. 10. The apertures are designated with reference numeral 1010. The apertures 1010 extend all the way through the thickness of the mask structure 900.

In an advantageous embodiment of the mask structure 900 of the present invention, the apertures 1010 are formed in the shape of squares with each square having a side that is "L" units long. The size "L" of each square is intentionally designed to be less than the size of the resolution limitation of the Photo Exposure System.

It is understood that the principle of the present invention is not limited to apertures that have a square shape. The square shape is relatively easy to manufacture. However, the square shape is only one advantageous embodiment of the shape of an aperture. It is understood that other shapes could also be used. The important feature is that the size of the aperture (whatever its shape) is less than the size of the resolution limitation of the Photo Exposure System.

It is also understood that the principle of the present invention is not limited to the particular density of the apertures 1010 within mask 900 that is shown in FIG. 9 and in FIG. 10. The density of the apertures 1010 within mask 900 may be selected from a range of densities. Similarly, the number of columns (or the number of rows) of the apertures 1010 is not limited to the number of columns (or the number of rows) of the apertures 1010 that are shown in FIG. 9 or in FIG. 10. Any number may be selected for the number of columns (or the number of rows) of the apertures 1010.

Figure 11:
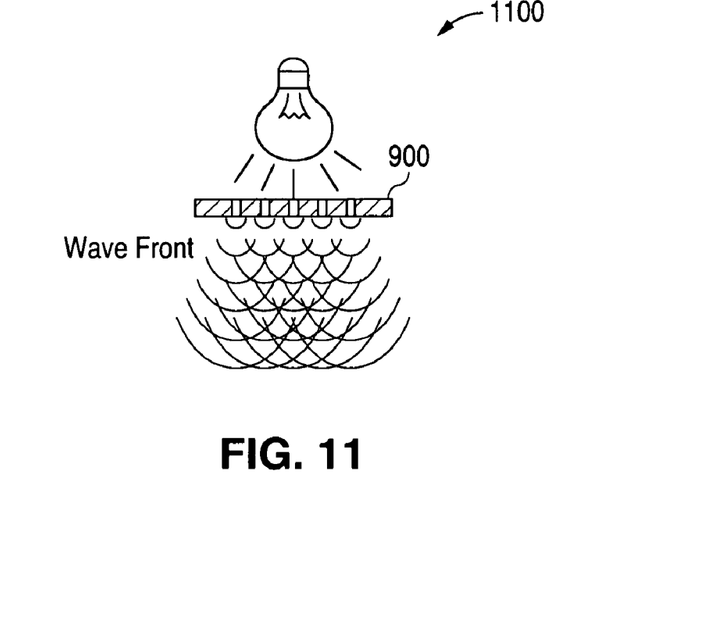
FIG. 11 illustrates a schematic diagram showing wavefronts of light that have passed through apertures of a mask structure of the present invention.
Figure 12:
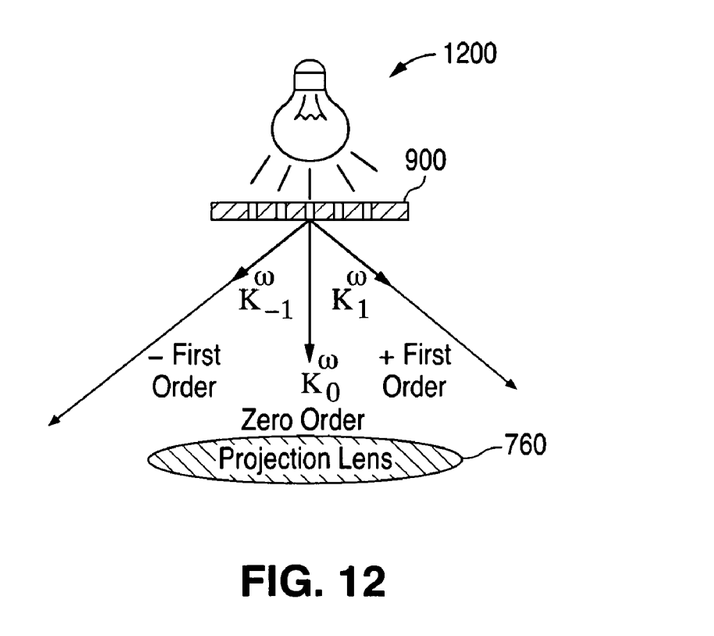
FIG. 12 illustrates a schematic diagram representing the wavefronts of light shown in FIG. 11 with a zero order diffraction component, a positive first order diffraction component, and a negative first order diffraction component.

FIG. 11 illustrates a schematic diagram 1100 that shows exemplary wavefronts of light that have passed through the apertures 1010 at the edge of the mask structure 900 of the present invention. FIG. 12 illustrates a schematic diagram 1200 that represents the wavefronts of light shown in FIG. 11. As shown in FIG. 12, the wavefronts may be represented with a zero order component $K_0^\omega$ that is perpendicular to the plane of the projection lens 760, and a positive first order component $K_1^\omega$ at a positive angle to the zero order component $K_0^\omega$, and a negative first order component $K_{-1}^\omega$ at a negative angle to the zero order component $K_0^\omega$.

Only the zero order diffraction light passes through the apertures 1010 of mask 900 when the size of the apertures 1010 is less than the resolution limitation of the Photo Exposure System. Zero order diffraction light does not have enough energy to print the image clearly when the size of the apertures 1010 is less than the size of the resolution limitation of the Photo Exposure System. However, the light will have enough accumulated exposure energy to partially change the underlying photo resist material.

During a subsequent photo develop process, imaging spaces that have a size that is larger than the size of the resolution limitation will operate normally. That is, exposed photo resist material will be stripped away from the wafer surface. Unexposed photo resist material will remain and subsequently be hardened in a photo resist bake process.

In contrast, the photo resist material under the "mosaic" of apertures 1010 of the mask 900 will be partially removed in a subsequent photo develop process. The partial removal of photo resist material will form a rounded surface that slopes from the top to the edge of the photo resist material. This result is illustrated in FIG. 13 and in FIG. 14.

Figure 13:
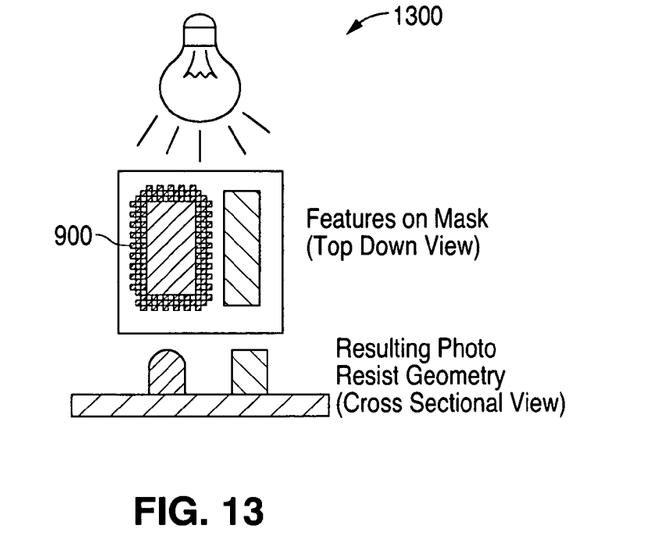
FIG. 13 illustrates a schematic diagram showing a plan view of the mask structure of the present invention and a plan view of a prior art mask structure and a cross sectional view of their respective resulting photo resist floating gate geometry.

FIG. 13 illustrates a schematic diagram 1300 showing a plan view of the mask structure 900 of the present invention adjacent to a plan view of a prior art mask structure. FIG. 13 also illustrates a cross sectional view of the geometry of the photo resist material that results from applying light to the two mask structures. As shown in FIG. 13, application of light to the prior art mask results in a photo resist material that has a sharp vertical edge. Application of light to the mask structure 900 of the present invention results in a photo resist material that has a rounded surface that slopes from the top to the edge of the photo resist material.

Figure 14:
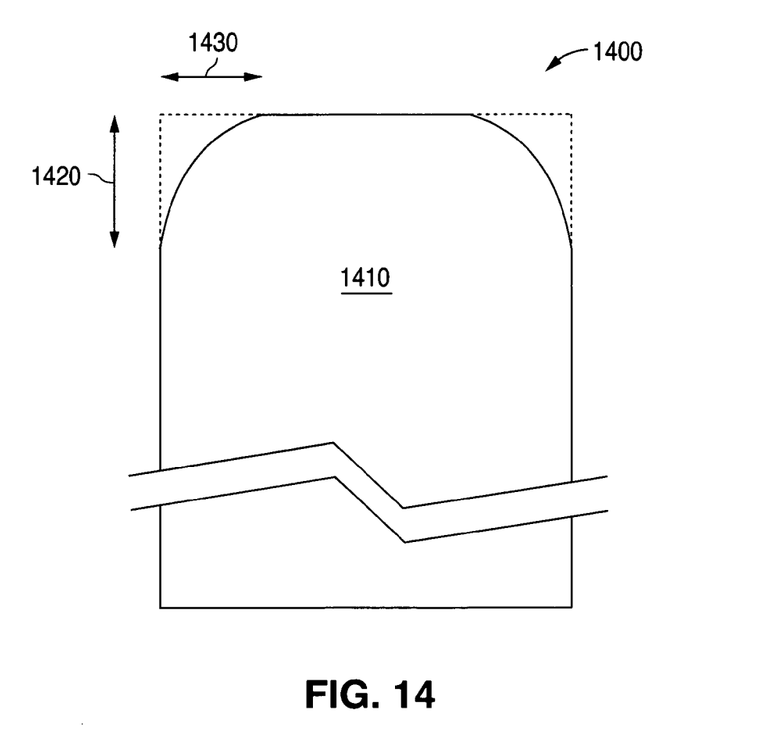
FIG. 14 illustrates a schematic diagram showing an enlarged cross sectional view of an exemplary floating gate pattern obtained using an advantageous embodiment of the method of the present invention.

FIG. 14 illustrates a schematic diagram 1400 showing an enlarged cross sectional view of the pattern in the resist material that is obtained using the resist mask 900 of the present invention. The resist material is designated with reference numeral 1410. The vertical decrease in the edge of the resist material 1410 is designated with the reference numeral 1420. The horizontal decrease in the edge of the resist material 1410 is designated with the reference numeral 1430.

After the photo develop process, the floating gate (FG) polysilicon will be etched. Under the same polysilicon etch process in the CMOS core, the photo resist pattern will be transferred to the floating gate pattern. In this manner the edge of the floating gate of the memory cell will have a rounded sloping surface. The rounded sloped surface on the edge of the floating gate allows more dielectric material (e.g., TEOS) to cover the edge of the floating gate. A thicker covering of dielectric material over the floating gate improves the dielectric material conformity in the memory cell. As previously described, this reduces the backend leakage current from the floating gate and enhances the retention reliability of the memory cell. A thicker covering of dielectric material over the floating gate also increases the breakdown voltage of the memory cell.

The number of apertures 1010 that are located around the edge of the mask structure 900 determines how far the rounded sloped surface of the floating gate will extend from the edge to the center of floating gate. Increasing the concentration of apertures 1010 at the edge of the mask structure 900 allows more of the surface of the floating gate to be altered by the optical proximity correction (OPC) process of the method of the invention.

The size of each aperture 1010 (e.g., the length L of each square 1010 in FIG. 10) determines how deep or how low the slope is. That is, the size of each aperture 1010 determines the magnitude of the vertical decrease 1420. When the size of each aperture 1010 is greater than the resolution limitation, then all of the photo resist material under the aperture 1010 will be removed. As the size of the aperture 1010 becomes smaller and smaller, then less of the photo resist material under the aperture 1010 will be removed. Finally, if the size of the aperture 1010 is zero (i.e., the aperture is closed), then all of the photo resist material will remain in place and the full thickness of the floating gate will not be decreased.

The number and size of the apertures 1010 in the mask 900 can be selected to create a desired slope or curvature combination that optimizes the performance of the nonvolatile memory (NVM) cells. For example, the size of the apertures 1010 may be selected to be larger at the edge of the mask 900 and selected to be progressively smaller toward the center of the mask 900. This will achieve a variable slope from the edge to the center of the photo resist material. The slope will be greater at the edge and more gradual toward the center of the pattern.

FIG. 15 illustrates a comparison of a prior art fabrication method with the fabrication method of the present invention. FIGS. 15A, 15C and 15E illustrate schematic diagrams showing successive steps in a prior art photo resist method. The prior art method creates a sharp edge on the photo resist material. FIGS. 15B, 15D and 15F illustrate schematic diagrams showing successive steps in the method of the present invention. The method of the present invention creates a rounded sloped edge on the photo resist material.

Figure 15A:
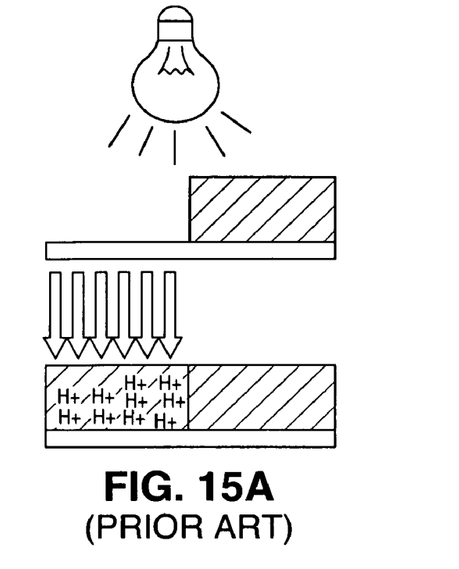
FIGS. 15A, 15C and 15E illustrate schematic diagrams showing successive steps in a prior art method that creates a sharp edge on an underlying photo resist material.
Figure 15B:
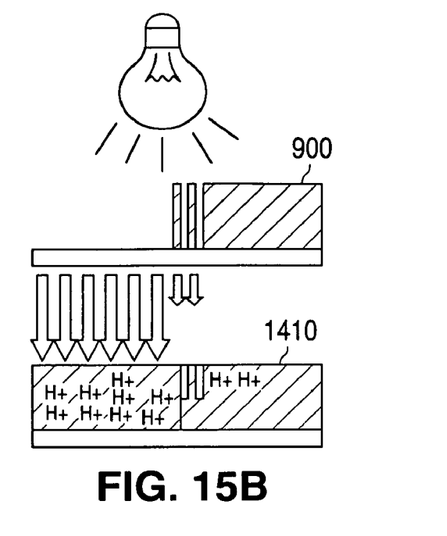
FIGS. 15B, 15D and 15F illustrate schematic diagrams showing successive steps in an exemplary embodiment of a method of the present invention that creates a rounded edge on an underlying photo resist material.

In the first step of each method, the underlying photo resist material is exposed through a mask. As shown in FIG. 15B, the method of the present invention uses mask 900. Because the size of the apertures 1010 in mask 900 is less than the resolution limitation, only a portion of the underlying photo resist material 1410 is affected by the light that passes through the apertures 1010.

Figure 15C:
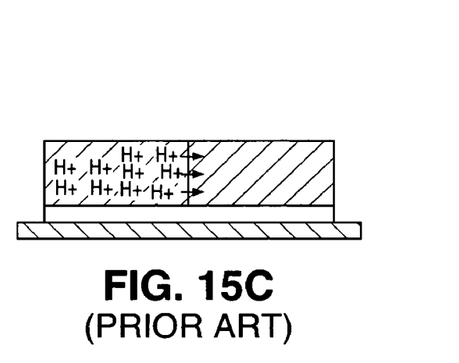
Figure 15D:
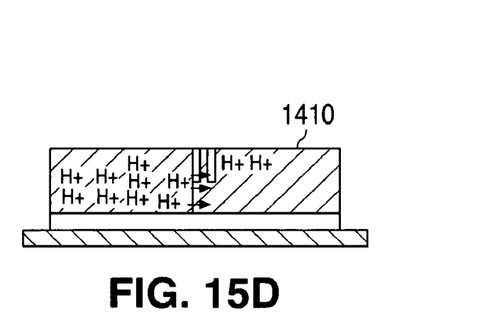

In the next step of each method, a post exposure bake process (also known as a "soft bake" process) is applied. This step enhances the photo resist sensitivity and the overall process latitude. This step is represented in FIG. 15C for the prior art method and in FIG. 15D for the method of the invention.

Figure 15E:
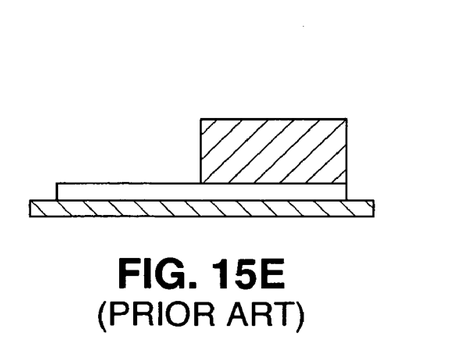
Figure 15F:
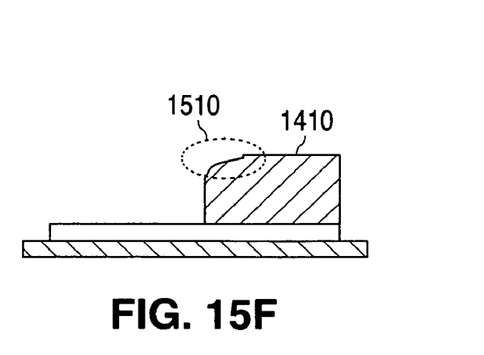

In the next step of each method, a develop process is applied. The exposed area in the prior art method (as shown in FIG. 15E) is completed removed by the develop process. In the method of the present invention, the completely exposed area is also removed (as shown in FIG. 15F). The partially exposed area of the underlying photo resist material 1410 that was located under the apertures 1010 of mask 900 is partially removed. This area is designated with reference numeral 1510 in FIG. 15F.

In the next step of each method, a post develop bake process (also known as a "hard bake" process) is applied. The hard bake process is not shown in FIG. 15. The hard bake process removes residual solvent and improves resist adhesion (hardens any non-exposed resist material) during a subsequent wet etch process.

Figure 16:
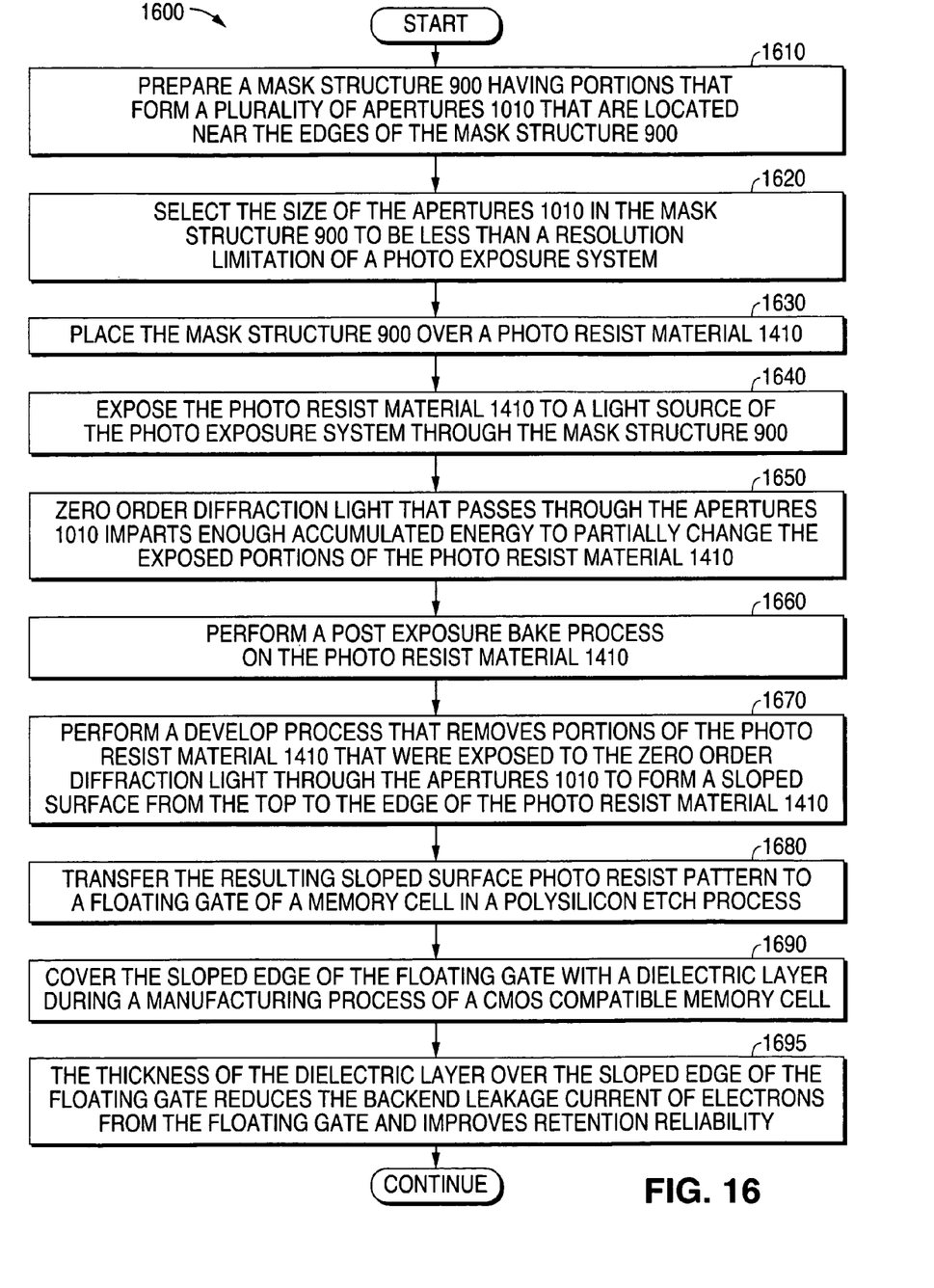
FIG. 16 illustrates a flow chart showing the steps of an advantageous embodiment of the method of the present invention.

FIG. 16 illustrates a flow chart 1600 showing the steps of an advantageous embodiment of the method of the present invention. In the first step of the method, a mask structure 900 is prepared that has portions that form a plurality of apertures 1010 that are located near the edges of the mask structure 900 (step 1610). The size of the apertures 1010 in the mask structure 900 is selected to be less than a resolution limitation of a Photo Exposure System (step 1620).

The mask structure 900 is then placed over a photo resist material 1410 (step 1630). The photo resist material 1410 is then exposed to a light source through the mask structure 900 (step 1640). Zero order diffraction light that passes through the apertures 1010 imparts enough accumulated energy to partially change the exposed portions of the photo resist material 1410 (step 1650). A post exposure bake process is then performed on the photo resist material 1410 (step 1660).

A develop process is then performed that removes portions of the photo resist material 1410 that were exposed to the zero order diffraction light through the apertures 1010 to form a sloped surface from the top to the edge of the photo resist material 1410 (step 1670). The resulting sloped surface photo resist pattern is then transferred to a floating gate of a memory cell in a polysilicon etch process (step 1680).

The sloped edge of the floating gate is subsequently covered with a dielectric layer during a manufacturing process of a CMOS compatible memory cell (step 1690). The thickness of the dielectric layer over the sloped edge of the floating gate reduces the backend leakage current of electrons from the floating gate and improves retention reliability of the memory cell (step 1695).

An advantageous embodiment of the system and method of the present invention has been described that alters the shape of a polysilicon floating gate of a nonvolatile memory (NVM) cell in order to decrease the backend leakage current of electrons from the floating gate. It is understood that the system and method of the invention can also be used to achieve other goals. That is, the system and method of the present invention is not limited to altering the shape of a polysilicon floating gate. Alterations to other elements of electronic devices are also within the scope of the present invention.

The foregoing description has outlined in detail the features and technical advantages of the present invention so that persons who are skilled in the art may understand the advantages of the invention. Persons who are skilled in the art should appreciate that they may readily use the conception and the specific embodiment of the invention that is disclosed as a basis for modifying or designing other structures for carrying out the same purposes of the present invention. Persons who are skilled in the art should also realize that such equivalent constructions do not depart from the spirit and scope of the invention in its broadest form.

Although the present invention has been described with an exemplary embodiment, various changes and modifications may be suggested to one skilled in the art. It is intended that the present invention encompass such changes and modifications as fall within the scope of the appended claims.

What is claimed is:

1. A method for manufacturing a floating gate of a memory cell, the method comprising the steps of:
forming a mask structure having a plurality of apertures through the mask structure, the apertures having an aperture size less than a resolution limitation of a photo exposure system;
exposing a photo resist material to a light source of the photo exposure system using the mask structure;
forming a sloped surface on the photo resist material by removing portions of the photo resist material exposed to the light source through the apertures in the mask structure;
etching conductive material using the photo resist material to form the floating gate, wherein the etching comprises transferring the sloped surface on the photo resist material to the conductive material to form a sloped surface on the conductive material; and
covering the conductive material with a dielectric material.

2. The method as claimed in claim 1, wherein forming the mask structure comprises the step of:
forming the plurality of apertures along at least one edge of the mask structure.

3. The method as claimed in claim 1, wherein each aperture has a square shape.

4. The method as claimed in claim 1, wherein forming the mask structure comprises the step of:
forming the plurality of apertures in a plurality of rows that are parallel to at least one edge of the mask structure, wherein the apertures in each row are located diagonally with respect to the apertures in an adjacent row.

5. The method as claimed in claim 1, further comprising the step of:
selecting the aperture size for each of the plurality of apertures from a range of aperture sizes, wherein each aperture size in the range of aperture sizes is less than the resolution limitation of the photo exposure system.

6. A method for forming a floating gate of a memory cell, the method comprising the steps of:
manufacturing a mask structure having a plurality of apertures through the mask structure, wherein an aperture size for the plurality of apertures is less than a resolution limitation of a photo exposure system;
placing the mask structure over a photo resist material;
exposing the photo resist material to a light source of the photo exposure system;
passing zero order diffraction light from the light source though the plurality of apertures in the mask structure;
imparting energy from the zero order diffraction light to portions of the photo resist material;
forming a sloped surface on the photo resist material by removing the portions of the photo resist material exposed to the zero order diffraction light;
etching conductive material using the photo resist material to form the floating gate, wherein the etching comprises transferring the sloped surface on the photo resist material to the conductive material to form a sloped surface on the conductive material; and
covering the conductive material with a dielectric material.

7. The method as claimed in claim 6, wherein forming the sloped surface on the photo resist material further comprises the step of:
performing a develop process on the photo resist material.

8. The method as claimed in claim 6, wherein manufacturing the mask structure comprises the step of:
forming the plurality of apertures in a plurality of rows that are parallel to at least one edge of the mask structure, wherein the apertures in each row are located diagonally with respect to the apertures in an adjacent row.

9. The method as claimed in claim 6, wherein etching the conductive material comprises performing a polysilicon etch process.

10. A method for forming a floating gate of a memory cell, the method comprising the steps of:
manufacturing a mask structure having a plurality of apertures through the mask structure, wherein an aperture size for the plurality of apertures is less than a resolution limitation of a photo exposure system;
placing the mask structure over a photo resist material;
exposing the photo resist material to a light source of the photo exposure system;
passing zero order diffraction light from the light source though the plurality of apertures in the mask structure;
imparting energy from the zero order diffraction light to portions of the photo resist material;
performing a develop process on the photo resist material;
forming a sloped surface from a top to an edge of the photo resist material by removing the portions of the photo resist material that were exposed to the zero order diffraction light through the plurality of apertures through the mask structure; and
etching conductive material using the photo resist material to form the floating gate, wherein the etching comprises transferring the sloped surface on the photo resist material to the conductive material to form a sloped surface on the floating gate.

11. The method as claimed in claim 10, wherein manufacturing the mask structure comprises the step of:
forming the plurality of apertures in a plurality of rows that are parallel to at least one edge of the mask structure, wherein the apertures in each row are located diagonally with respect to the apertures in an adjacent row.

12. The method as claimed in claim 10, wherein each aperture has a square shape.

13. The method as claimed in claim 10, wherein etching the conductive material comprises the step of:
transferring the sloped surface on the photo resist to the floating gate of the memory cell in a polysilicon etch process.

14. The method as claimed in claim 13, further comprising the step of:
covering the sloped surface of the floating gate with a dielectric layer.

15. The method as claimed in claim 14, further comprising the step of:
decreasing a backend leakage current of electrons from the floating gate with a thickness of the dielectric layer over the sloped surface of the edge of the floating gate.

16. A method comprising:
placing a mask structure having multiple apertures through the mask structure over a photo resist material, each aperture having an aperture size less than a resolution limitation of a photo exposure system;
exposing the photo resist material to a light source of the photo exposure system using the mask structure;
forming a sloped surface on the photo resist material by removing portions of the photo resist material exposed to the light source through the apertures in the mask structure;
etching conductive material using the photo resist material to form the floating gate, wherein the etching comprises transferring the sloped surface on the photo resist material to the conductive material to form a sloped surface on the conductive material; and
covering the conductive material with a dielectric material.

17. The method of claim 16, wherein exposing the photo resist material comprises:
passing zero order diffraction light from the light source though the apertures in the mask structure; and
imparting energy from the zero order diffraction light to portions of the photo resist material.

18. The method of claim 17, further comprising:
performing a develop process on the photo resist material.

19. The method of claim 18, wherein forming the sloped surface on the photo resist material comprises:
forming the sloped surface from a top to an edge of the photo resist material by removing the portions of the photo resist material that were exposed to the zero order diffraction light through the apertures in the mask structure.

20. The method of claim 19, wherein transferring the sloped surface on the photo resist material to the conductive material comprises:
transferring the sloped surface photo resist pattern to the floating gate of the memory cell in a polysilicon etch process.

* * * * *